United States Patent
Liu

(10) Patent No.: US 6,420,891 B1
(45) Date of Patent: Jul. 16, 2002

(54) WAFER PROBER FOR IN-LINE CLEANING PROBE CARD

(75) Inventor: Yu-Hsin Liu, Hsinchu (TW)

(73) Assignee: Powerchip Semiconductor Corporation (TW)

( * ) Notice: Subject to any disclaimer, the term of this patent is extended or adjusted under 35 U.S.C. 154(b) by 46 days.

(21) Appl. No.: 09/640,184

(22) Filed: Aug. 17, 2000

(51) Int. Cl.⁷ .......................... G01R 31/02; G01R 1/04; B08B 7/00

(52) U.S. Cl. .................... 324/757; 324/754; 324/158.1; 134/6; 134/7

(58) Field of Search ................................ 324/754, 757, 324/158.1; 134/1.1, 1.2, 1.3, 11, 131, 6, 7; 15/322

(56) References Cited

U.S. PATENT DOCUMENTS

| | | | |
|---|---|---|---|
| 4,923,828 A | * | 5/1990 | Gluck et al. ............... 134/1.2 |
| 5,935,339 A | * | 8/1999 | Henderson ................... 134/1 |
| 6,033,484 A | * | 3/2000 | Mahoney ..................... 134/1 |
| 6,057,694 A | * | 5/2000 | Matsuda ..................... 324/757 |
| 6,092,537 A | * | 7/2000 | Kanno ....................... 134/1.2 |

OTHER PUBLICATIONS

Patent Abstract of 63–015,870 (Osaka Oxygen Ind. Ltd.). fled May 38, 1988 in Japan.

* cited by examiner

*Primary Examiner*—N. Le
*Assistant Examiner*—Anjan K. Deb

(57) ABSTRACT

A wafer prober capable of cleaning probe pins in-line is provided. The wafer prober is used in the wafer probing test system, which includes a test machine and a test head. The wafer prober includes a housing having a probe card holder for holding a probe card, a staging device installed in said housing and moving along a X-Y-Z plane, and a chuck installed on the staging device for holding a wafer to be tested. Additionally, the wafer prober employs at least a nozzle installed at the staging device for cleaning probe pins of the probe card by spraying solid, vapor and liquid material. Since the wafer prober does not need to remove the probe card away to clean, and does not need to position the probe card again, the production downtime can be greatly reduced. Additionally, due to that the wafer prober employs the nozzle to spray out three phases of $CO_2$ to clean the probes, the probes do not be damaged and the lifetime of the probes can be extended.

2 Claims, 4 Drawing Sheets

WAFER PROBER FOR IN-LINE CLEANING PROBE CARD

BACKGROUND OF THE INVENTION

A. Field of the Invention

The present invention relates to a wafer probing test machine, more specifically, to a wafer prober to clean probe card in-line by spraying three phases of $CO_2$.

B. Description of the Related Art

In the course of testing wafers of semiconductor devices, pads of wafer chip are contacted with probe-card to test or examine whether or not the electric circuit on each chip is disconnected and also to test electric characteristics of each chip. The wafer probing test machine (or wafer prober) is used for this wafer test.

FIGS. 1 and 2 illustrate a typical testing apparatus 100 including a prober 120, a test head 130 and a tester 150. The testing apparatus 100 is used to test the performance of a die on a wafer. As illustrated, a probe card 140 sits below and in contact with test head 130. During testing, the prober 120 supports the wafer 123 on a chuck 122 and positions the wafer 123 so as to precisely align the bond pads of a die to be tested with the probe tips 142 on the probe card 140. The chuck 122 is connected to a staging device 124 by rods 121.

The staging device 124 typically positions the chuck 122 along a x-y-z plane by moving along a stage floor 125 on a ball screw stage assembly (not shown). The chuck 122 typically includes a vacuum chuck wherein the wafer 123 being tested is held in position by drawing a vacuum within a plurality of interconnecting channels (not shown) that are formed within the surface of the chuck. Once aligned, chuck 122 is raised via rods 121 such that the bond pads of the die on the wafer 123 are forced against the probe tips 142 on the probe card 140.

Typically, the bond pads of the die on the wafer 123 are made of metallic materials, such as aluminum, which can oxidize when exposed to air. Also, organic material left over from certain fabrication processes can be disposed on the bond pads. When probe card tips 142 repeatedly contact bond pads on the wafer 123, metal oxides such as aluminum oxides and other materials on the bond pads can build-up on the probe card tips 142, as illustrated in FIG. 3. Thereby the materials built-up on the probe card tips 142 interfere with the function of the probe pins during testing operations. Thus, it becomes necessary to periodically clean the probe pins on a probe card.

In conventional cleaning operations, a probe maintenance station is utilized in order to clean probe pins on a probe card used in testing fabricated semiconductor device. This requires the removal of the probe card from the production line in order to clean the probe pins and then results in a certain amount of production downtime. The production downtime includes the time to remove the probe card from the prober, and the time to install and perform a complete new set up for a clean probe card. Also, as manufacturing techniques have improved, it has become possible to probe more semiconductor dies in parallel at one time and therefor requires increasingly wider probe card arrays. This has resulted in ever increasing difficulty and downtime in order to have the probe card arrays taken off-line, to replace the probe card arrays, and then to bring the system back on-line, as well as additional time to clean the removed probe card arrays and bring the arrays back into the service.

Accordingly, there is a need for improving probe pin cleaning systems and methods that overcome or avoid the above problems.

SUMMARY OF THE INVENTION

It is an object of present invention to provide a wafer prober capable of cleaning probe pins in-line, which employs sprayer, such as $CO_2$ triple point sprayer, to in-line clean the probe pins on probe card.

According to one aspect of the present invention, the wafer prober capable of cleaning probe pins in-line according to the present invention is used in the wafer probing test system having a test machine and a test head. The wafer prober includes a housing having a probe card holder for holding a probe card, a staging device installed in the housing and moving along a X-Y-Z plane, and a chuck installed on the staging device for holding a wafer to be tested. The chuck further includes at least a nozzle installed at the staging device for cleaning probe pins of the probe card by spraying solid, vapor and liquid $CO_2$.

Since the wafer probing test system according to the present invention does not need to remove the probe card away from the prober to clean, and does not need to position the probe card again, the production downtime can be greatly reduced. Additionally, due to that the wafer probing test system employs the nozzle to spray out three phases of $CO_2$ to clean the probes, the probes do not be damaged and the lifetime of the probe can be extended.

BRIEF DESCRIPTION OF THE DRAWINGS

These and other objects and advantages of the present invention will become apparent by reference to the following description and accompanying drawings wherein.

DETAILED DESCRIPTION

Figure 1:
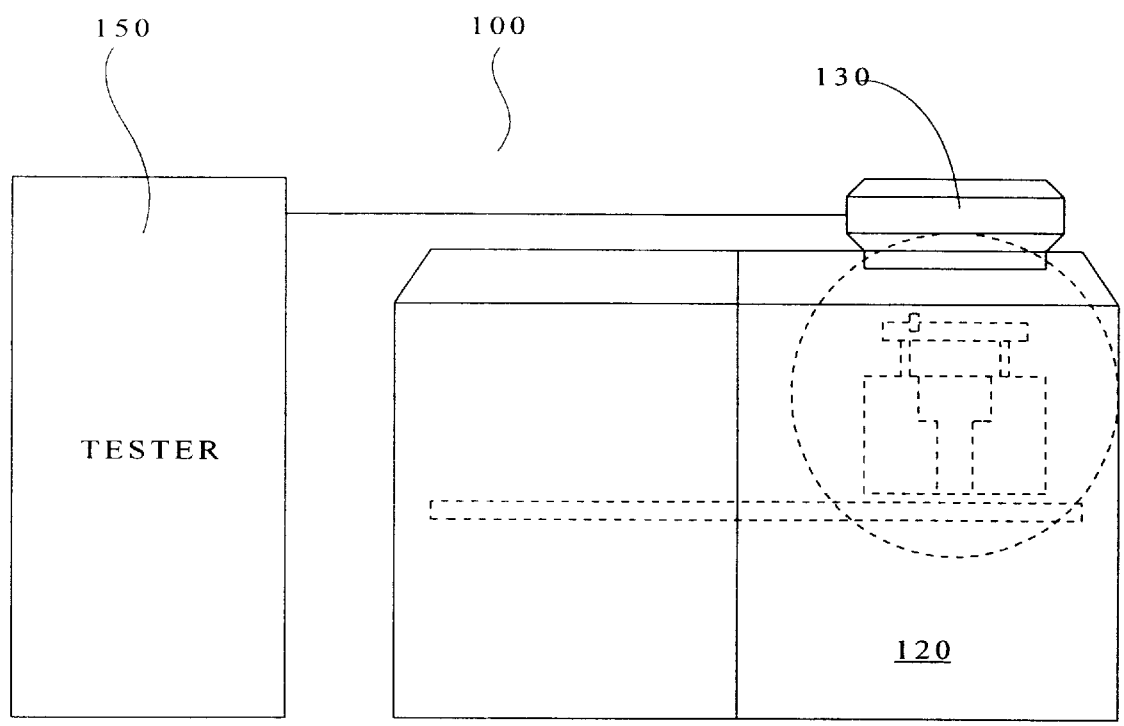
FIG. 1 illustrates a typical prior art tester, test head and wafer prober.
Figure 3:
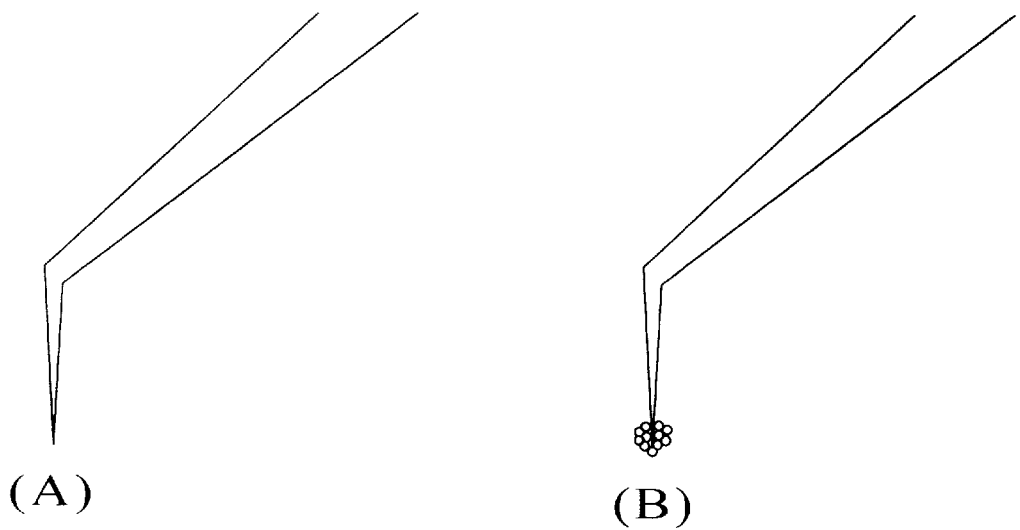
FIG. 3 illustrates the probe pins built-up with aluminum oxides and other materials.
Figure 2:
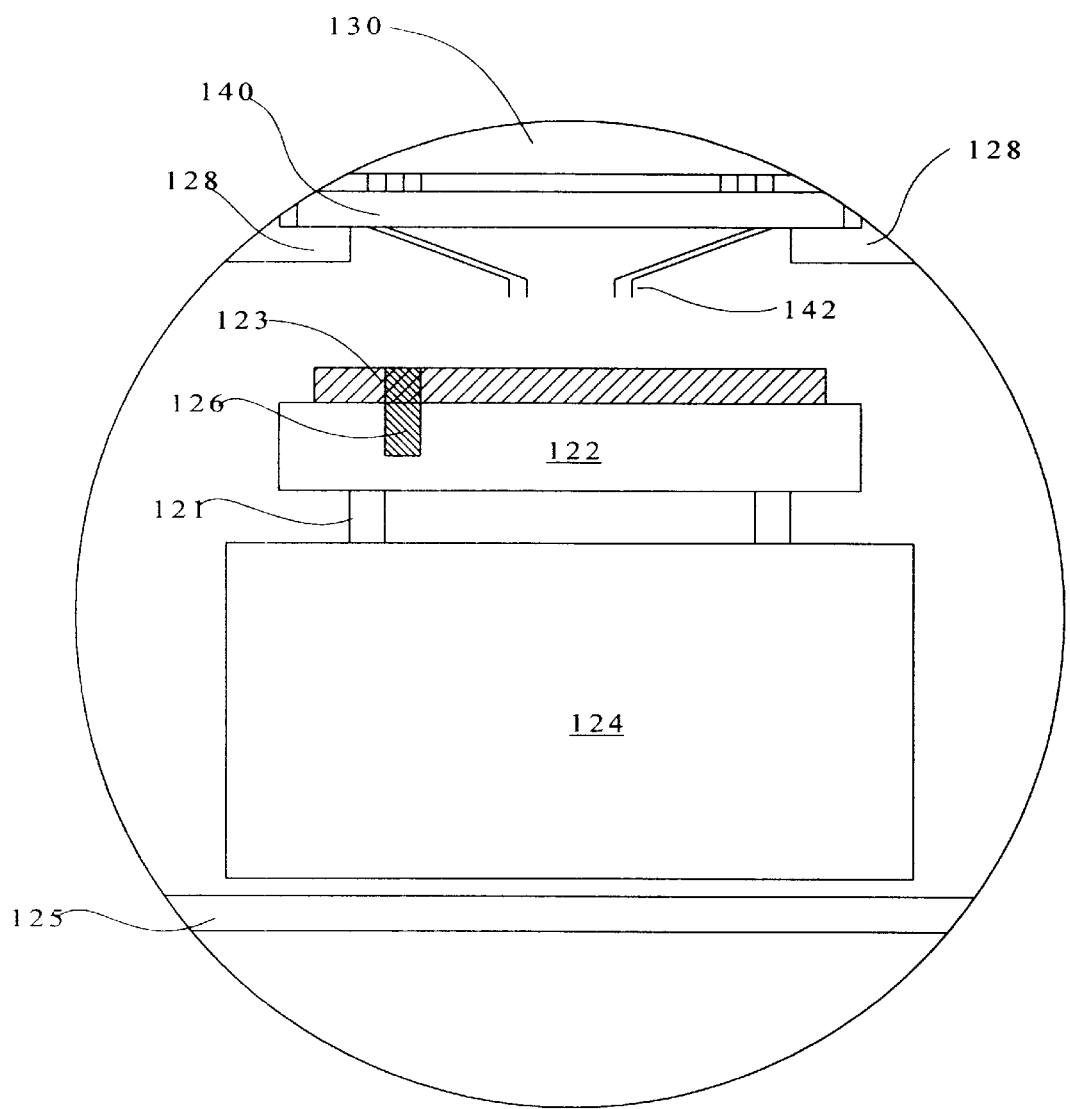
FIG. 2 illustrates an enlarged view of the wafer prober depicted in the FIG. 1.
Figure 4:
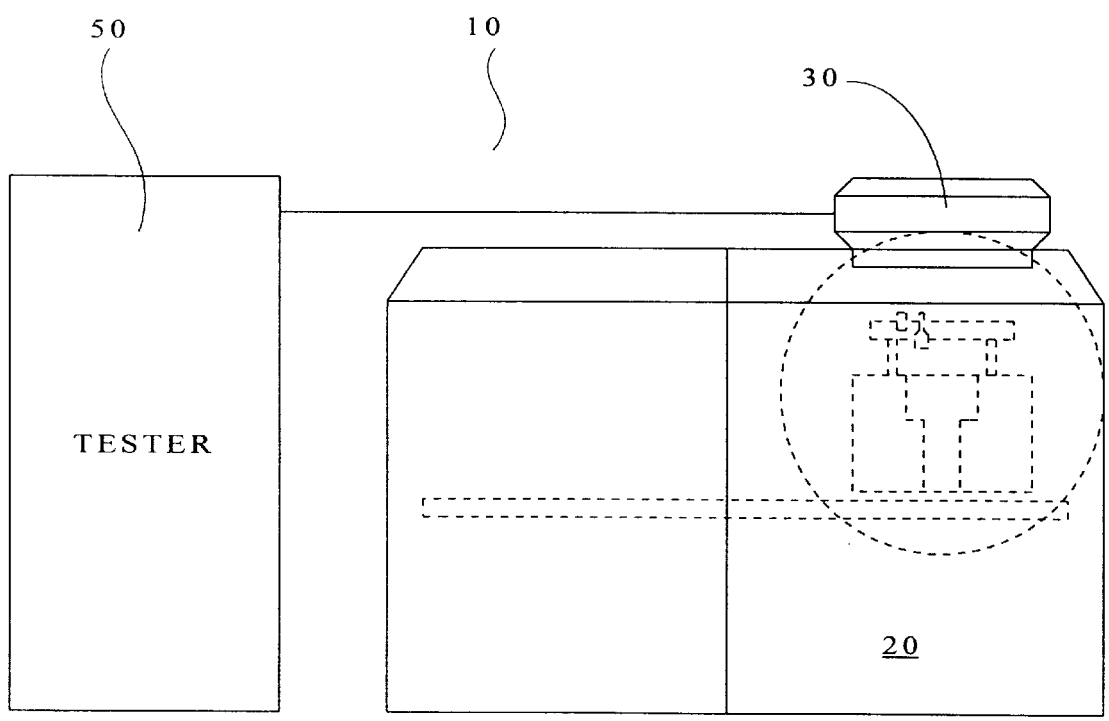
FIG. 4 illustrates an embodiment of present invention having a cleaning system.
Figure 5:
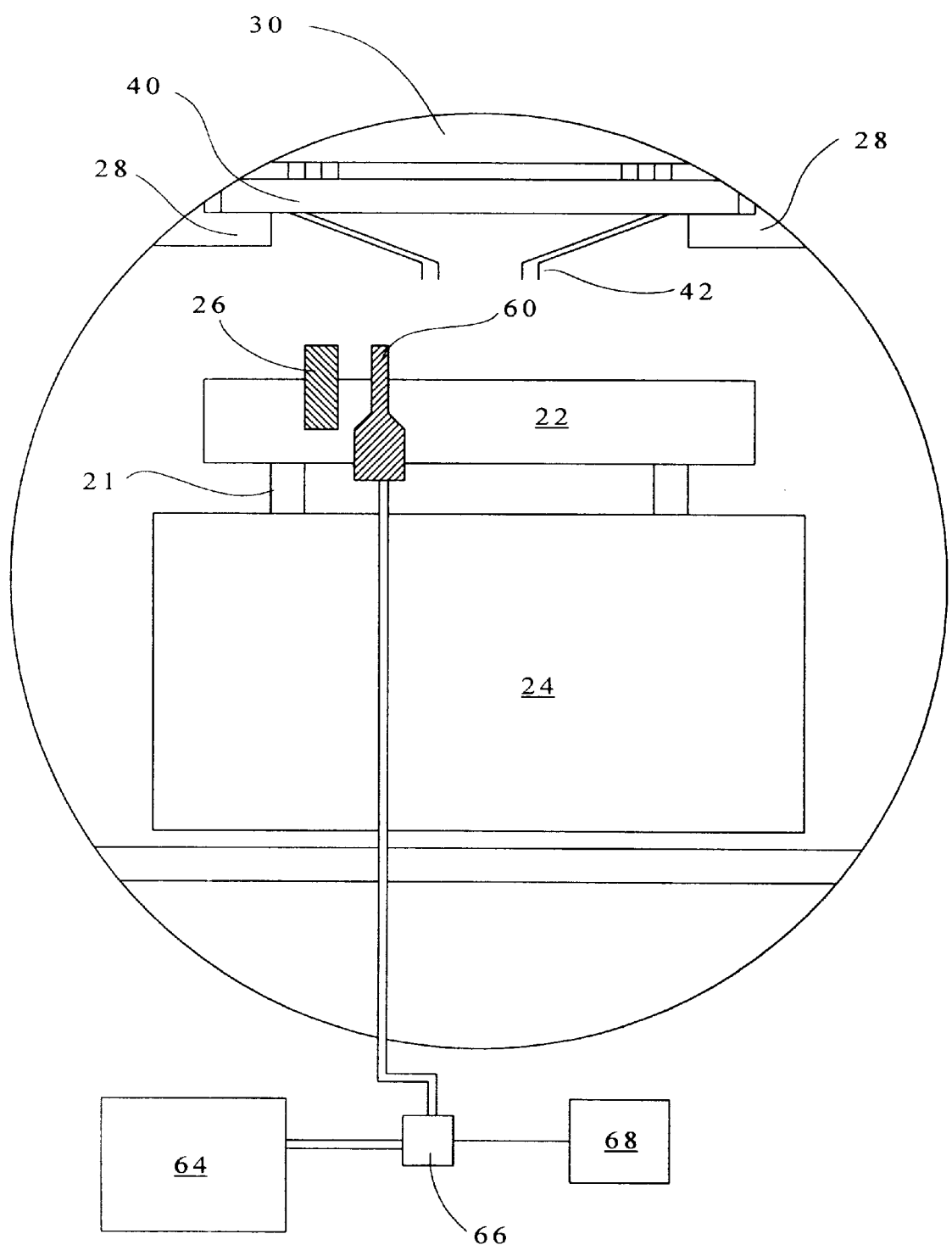
FIG. 5 illustrates an enlarged view of the wafer prober depicted in the FIG. 4.

An apparatus that in-line cleans the probes of probe card in a wafer probing test system is described. FIG. 4 illustrates an embodiment of a wafer prober 20 according to the present invention. The wafer prober 20 is used for the wafer probing test system 10. FIG. 5 illustrates an enlarged view of the wafer prober depicted in the FIG. 4. Like the prior art of wafer probing test system 100 shown in FIG. 1, the wafer probing test system 10 also includes a wafer prober 20, test head 30, a probe card located under the test head 30, and tester 50 electrically coupled with the test head 30. The wafer probing test system 10 employs the wafer prober 20 to hold a wafer to be tested, and uses the probes 42 of the probe card 40 to contact with the pad of the wafer. The tester 50 is electrically coupled with the test head 30, and receives the electric signals to analysis the electric characteristic of each chip.

As illustrated in FIG. 5, the wafer prober 20 also includes a staging device 24, a chuck 22 coupled with the staging device 24, and a camera device 26, such as CCD, installed on the staging device 24 for grabbing the image of the probe 42. During the testing, the control flow of the wafer probing test system 10 is same as the control flow of prior art system, therefore the detailed description is omitted.

The wafer prober 20 further includes a nozzle 60 such as triple points sprayer for cleaning the probe 42, a valve 66 for providing liquid material such as liquid $CO_2$ to the nozzle 60, and a control unit 68 for controlling the action of the valve 66. In addition, a $CO_2$ container 64 is connected to the valve 66 via a pipe to provide liquid $CO_2$ to the nozzle 60 via the valve 66. The nozzle 60 is installed at the chuck 22 and sprays the solid, vapor and liquid material to the probe 42.

When liquid $CO_2$ is released from a room temperature cylinder to atmospheric pressure, it passes through its triple point, and a portion of the liquid $CO_2$ is converted to dry ice particles and to vapor stream. The dry ice particles produce a strong "snow fall" effect (Joule Thomason Effect) and are directed to the surface to remove the dust or particles. The nozzle, such as triple point's sprayer is used to adjust the dry ice particle size and the shape of the spray pattern to fit a wide variety of applications. Typical dry ice particle sizes are in the 5 micro meter range which produce a rather aggressive "hail storm", but they can be adjusted in size to about 0.5 cm where they produce a very gentle snow fall effect for cleaning the most delicate surfaces. The liquid $CO_2$ can penetrate the boundary layer and dissolve thin organic layers of oils and fluxes. This solvent action is due to a thin layer of liquid $CO_2$ that forms at the collision interface between a dry ice particle and the surface. This liquid is generated at the moment of impact when the dry ice particle is deformed. Surface pressure on the dry ice particle rises above the triple point pressure of 75 psia. At this pressure, all three phases of $CO_2$ are present: solid, vapor and liquid. Liquid $CO_2$ is an excellent solvent for the organic. The very short duration of a liquid film at the interface dissolves the organic film contaminants, which are then carried away in the following flow of $CO_2$ snow and vapor.

Therefore, the wafer prober 20 according to the present invention employs the CCD 26 to align the nozzle 60 with the probes to be cleaned and sprays the liquid $CO_2$ toward the probes by the nozzle 60. Due to that the wafer probing test system 10 is working at atmospheric pressure and room temperature, the liquid $CO_2$ sprayed from the nozzle pass through its triple point and all three phases are present: solid, vapor and liquid. Then the metal oxides and other materials built-up on the pin tips of the probes 42 are carried away by the three phases of $CO_2$. Accordingly, when the probes 42 need to be cleaned the wafer probing test system 10 uses the CCD 26 to align the nozzle 60 with the probes 42 to be cleaned. Then the control unit 68 controls the valve 66 to spray the liquid $CO_2$ toward the probes 42 to perform the cleaning action.

Since the wafer probing test system 10 according to the present invention does not need to remove the probe card 40 away from the wafer prober 20 to clean, and does not need to position the probe card 40 again, the production downtime can be greatly reduced. Additionally, due to that the wafer probing test system 10 according to the present invention employs the nozzle 60 to spray out three phases of $CO_2$ to clean the probes 42, the probes does not be damaged and the lifetime of the probe can be extended.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A prober for in-line cleaning probes, the prober is utilized in a wafer probing test system, which includes a test machine, a test head, a probe card having a plurality of probes, said prober comprising:

a staging device;

a chuck installed on said staging device for holding a wafer to be tested; and at least one nozzle installed on said staging device for spraying three-phase coexisted $CO_2$ to clean said plurality of probes.

2. The prober according to claim 1, wherein said prober further comprises:

a valve for controlling said nozzle; and a control unit for controlling said valve.

\* \* \* \* \*